United States Patent [19]
Walpole et al.

[11] Patent Number: 5,400,353
[45] Date of Patent: Mar. 21, 1995

[54] TAPERED SEMICONDUCTOR LASER GAIN STRUCTURE WITH CAVITY SPOILING GROOVES

[75] Inventors: James N. Walpole, Concord; Emily S. Kintzer, Arlington; Stephen R. Chinn, Westford; Christine A. Wang, Bedford; Leo J. Missaggia, Milford, all of Mass.

[73] Assignee: Massachusetts Institute of Technology, Cambridge, Mass.

[21] Appl. No.: 148,386

[22] Filed: Nov. 8, 1993

Related U.S. Application Data

[63] Continuation of Ser. No. 829,778, Jan. 31, 1992, Pat. No. 5,260,822.

[51] Int. Cl.⁶ .................................................. H01S 3/19
[52] U.S. Cl. ........................................ 372/46; 372/19; 372/45; 372/50; 372/99
[58] Field of Search ............... 372/92, 45, 46, 50, 372/95, 96, 19, 99

[56] References Cited

U.S. PATENT DOCUMENTS

| | | | |
|---|---|---|---|
| 4,713,821 | 12/1987 | Bradford et al. | 372/44 |
| 4,744,089 | 5/1988 | Montroll et al. | 372/50 |
| 5,179,568 | 1/1993 | Lang | 372/95 |

OTHER PUBLICATIONS

*High-Power and Fundamental-Mode Oscillating Flared SBA Lasers* K. Shigihara, T. Aoyagi, S. Hinata, Y. Nagai, Y. Mihashi, Y. Seiwa K. Ikeda and W. Susaki, Electronics Letters, Sep. 01, 1988, vol.24 No. 18, pp. 1182–1183.

*A gaInAsP/InP Tapered-Waveguide Semiconductor Laser Amplifier Integrated with a 1.5μm Distributed Feedbak Laser*, P. A. Yazaki, K. Komori, G. Bendelli, S. Arai and Y. Suematsu, IEEE Transactions Photonics Technology Letters, vol. 3, No. 12, Dec. 1991 pp.1060–1063.

*A New Structure for High-Power TW-SLA*, G. Bendelli, K. Komori, S. Arai and Y. Suematsu, IEEE Photonics Technology Letters, vol. 3 No. 1, Jan. 1991, pp. 42–44.

Primary Examiner—James W. Davie
Attorney, Agent, or Firm—Hamilton, Brook, Smith & Reynolds

[57] ABSTRACT

A semiconductor laser gain structure having a tapered gain region comprising cavity spoilers for receiving light which is reflected off of the output facet back into the semiconductor and removing it from the gain region so as to reduce or eliminate self-oscillation. The boundaries of the gain region are also designed to have a very low refractive index gradient so as to minimize reflection of light off of the boundaries back into the gain region. The gain structure may be embodied in a semiconductor laser oscillator or semiconductor laser amplifier depending on whether the input facet is or is not, respectively, anti-reflection coated. The output facet is anti-reflection coated in either embodiment.

19 Claims, 5 Drawing Sheets

TAPERED SEMICONDUCTOR LASER GAIN STRUCTURE WITH CAVITY SPOILING GROOVES

GOVERNMENT SUPPORT

This invention was made with government support under Contract Number F19628-90-C-0002 awarded by the Air Force. The government has certain rights in the invention.

RELATED APPLICATION

This application is a continuation of application Ser. No. 07/828,778, filed Jan. 31, 1992, now U.S. Pat. No. 5,260,822.

FIELD OF THE INVENTION

The invention pertains to semiconductor laser amplifiers. More particularly, the invention pertains to semiconductor laser amplifiers having tapered amplification regions.

BACKGROUND OF THE INVENTION

Semiconductor laser oscillators (i.e., laser light sources, hereinafter lasers) and semiconductor laser amplifiers (i.e., hereinafter amplifiers) were first developed in the 1960s. Such laser oscillators and amplifiers offered the obvious advantage of extremely small size over the other types of lasers. (A typical semiconductor amplifier may be on the order of few hundred micrometers long). These first semiconductor lasers were fabricated of a single type of semiconductor.

A modern semiconductor laser oscillator or amplifier typically comprises a semiconductor heterostructure, that is, it is made from more than one semiconductor material such as gallium arsenide (GaAs) and aluminum gallium arsenide (AlGaAs). Semiconductor oscillators and amplifiers are made from a combination of semiconductor materials which have different bandgap energies in order to achieve electrical carrier confinement as well as different optical indices of refraction in order to achieve optical confinement.

Many approaches have been proposed to achieve the goal of high-power, continuous-wave operation with a single-lobed spatial mode output from semiconductor lasers or semiconductor amplifiers. One such approach is to employ a laterally tapered gain region.

An exemplary double heterostructure tapered amplifier 10 of the prior art is illustrated in FIGS. 1 and 2 and comprises three layers of semiconductor material; 1) a p-type material 12 with a relatively high bandgap, such as AlGaAs, 2) an n-type material 14 with relatively high bandgap, which may also be AlGaAs, and 3) a relatively low bandgap p-type material 16, such as GaAs, sandwiched between the other two layers and comprising the active region of the amplifier. More complex structures are also known. The active layer, instead of comprising a single layer of GaAs, may comprise a more complex multiple layer sequence. Layer sequences are known which provide higher gain and efficiency than the single layer GaAs active layer. For instance, a series of very thin layers into which carriers are injected may comprise the active region. Quantum size effects and higher carrier densities provide more gain in such structures. However, this is typically achieved at the cost of lower optical confinement. The lower optical confinement of such quantum wells may be offset by incorporating adjacent layers of intermediate refractive index. Single or multiple quantum wells with a variety of optical confinement structures generally provide superior performance to the single, thick active layer type devices. Performance can also be improved by introducing lattice strain into the quantum wells with particular alloy selections.

In general, any direct-band-gap semiconductor ternary or quaternary alloy system such as AlGaAs or InGaAsP whose various alloys can be selected to have lattice constants close to that of the growth substrate crystal can be used for laser amplifiers or oscillators.

An index-guided, linearly tapered gain region is formed in the active layer 16 having lateral boundaries illustrated by phantom lines 17 and 19 in FIG. 1. Commonly, the gain region is formed by etching through the active layer 16 and regrowing another semiconductor layer in the etched region. A metal contact pad 18 is placed in electrical contact with the top surface of the top layer commensurate with the underlying gain region. Accordingly, lines 17 and 19 also correspond to the boundaries of the electrical contact that pad 18 makes with the semiconductor. When sufficient current is passed through the metal contact, electrons and holes are injected into the active layer 16 in the gain region from the high bandgap material layers 12 and 14. These electrons and holes are trapped in the potential well created by the low band gap GaAs material. Since the electrons are trapped in the active region 16, they are forced to combine with each other in the GaAs material. Light introduced into this region will be amplified.

Confinement of the light around the GaAs active layer 16 is provided by the wave guide properties of the AlGaAs/GaAs/AlGaAs material structure. The AlGaAs layers have a lower optical index of refraction than that of the GaAs material thus providing total internal reflection of light off of the interfaces 13 and 15 so that most of the light remains within the GaAs layer 16 allowing active layer 16 to act essentially as a waveguiding layer.

In operation, substantially diffraction limited light generated by a low power laser 11 is focused by a lens system 21 on the input facet 20 of tapered amplifier 10. If the beam is allowed to spread naturally without any external interference, the beam will remain diffraction-limited as it spreads, thus leading to the desired single-mode amplified output beam. The expansion of the beam reduces the possibility of optical damage at the output facet 22 because the power in the beam is more spread out.

Due to the high gain achieved by semiconductor optical amplifiers, such amplifiers are easily susceptible to self-oscillation. Self-oscillation occurs when a small portion of the light striking the output facet is reflected back into the semiconductor medium. This reflected light is further amplified and a portion reflected again off of the input facet. If the total round trip product of amplification gain and reflection loss reaches unity, self-oscillation occurs. In this case, self-oscillation will build up from internal spontaneous emission, even in the absence of externally injected light.

In the case of semiconductor oscillators, as opposed to amplifiers, self-oscillation is necessary and, in fact, constitutes laser action. However, self-oscillation is undesirable in semiconductor amplifiers because it interferes with the amplification of the input light and may degrade the output mode quality as well as reduce gain.

This problem can be partially alleviated by using anti-reflection coatings on the input and output facets 20 and 22. However, a sufficiently small residual reflectivity is often difficult to achieve in practice and, in fact, may be impossible to incorporate in certain monolithic implementations where a semiconductor master oscillator laser and a semiconductor amplifier are integrated on the same chip. The problem is particularly severe in long amplifiers where the larger gains achieved can easily overcome very small reflection coefficients.

Examples of the state of the art of tapered semiconductor laser amplifiers are Bendelli, G., Komori, K., Arai, S., and Suematsu, Y., *A New Structure For High-Power TW-SLA*, IEEE Photonics Technology Letters, Vol. 3, No. 1, January, 1991, which discloses an exponentially tapered semiconductor laser amplifier having a high refractive index gradient at the boundaries of the tapered gain region; and Yazaki, P., Komori, K., Bendelli, G., Arai, S., and Suematsu, Y., *A GaInAsP/InP Tapered Waveguide Semiconductor Laser Amplifier Integrated with a 1.5 μm Distributed Feedback Laser*, IEEE Transactions Photonics Technology Letters, Vol. 3, No. 12, December, 1991, which discloses an exponentially tapered waveguide semiconductor laser amplifier monolithically constructed with a distributed feedback laser. The Yazaki et al. device also has a high refractive index gradient at the boundaries of the gain region.

Accordingly, it is an object of the present invention to provide an improved semiconductor laser amplifier.

It is a further object of the present invention to provide a tapered semiconductor amplifier with increased ability to suppress self-oscillation.

It is another object of the present invention to provide an improved high power, tapered semiconductor laser amplifier with improved spatial mode quality.

It is yet another object of the present invention to provide an improved semiconductor laser oscillator.

It is one more object of the present invention to provide a semiconductor gain structure that can be used as a laser oscillator or as a laser amplifier depending on the reflectivity of the input facet of the structure.

SUMMARY OF THE INVENTION

The invention comprises a tapered semiconductor gain structure which can be utilized as a semiconductor laser amplifier or a semiconductor laser oscillator. Operating as either an amplifier or an oscillator, the present invention provides an output beam which has both high power and good beam quality. As used herein, the term "beam quality" refers to the smoothness of the amplitude and phase distribution in the lateral direction (i.e., perpendicular to the direction of propagation and parallel the wave guiding active layer of the semiconductor). Beam quality along the axis perpendicular to the wave guiding layer and to the direction of propagation is determined by the wave guiding layer and can be made single mode. Accordingly, the smoother the amplitude and phase distribution in the lateral direction, the better the beam quality. The ideal output would be a beam without nulls in the amplitude or reversals of phase, such that, in the far field, the beam is single lobed and diffraction limited.

The invention comprises a semiconductor gain structure employing a tapered gain region between input and output facets. The lateral dimension of the gain region of the semiconductor is defined by a tapered electrical metal contact on the surface of the semiconductor through which a current is forced to flow. The semiconductor regions on opposite sides of the gain region, where no current flows, have intrinsic inter-band absorption loss.

A wave guiding layer is constructed by selective layering of semiconductor materials. Light having high beam quality is focused onto the input facet adjacent the gain region and propagates freely down the tapered gain region expanding by diffraction and gaining in power. There is no intentionally imposed refractive index gradient at the boundary of the gain region. The gain region is defined solely by the electrical contact. Accordingly, the amount of light reaching the gain structure's lateral boundary which is reflected into the gain structure is minimized, thereby reducing interference between reflected light and the amplified input light and generation of amplitude and spatial phase variations.

Further, two cavity spoilers are positioned in the semiconductor on opposite sides of the gain region. The cavity spoilers are normally positioned to receive as much of the light which is reflected off of the output facet back into the semiconductor as possible. The cavity spoilers may comprise light reflecting means, light scattering means, or light absorbing means so as to remove the light they receive from the semiconductor. Light absorbing means may comprise reverse biased junctions or ion implanted regions. Reflecting/scattering means may comprise any means for causing a sharp change in the refractive index in the wave guiding layer.

One preferred embodiment of the invention employs grooves etched through the wave guiding layer so as to define reflective surfaces at the edges of the grooves. The grooves are positioned so as to receive the majority of light which reflects off of the output facet back into the semiconductor and are angled to reflect that light away from the gain region and primarily into the substrate or the non-reflective lateral edges. Accordingly, undesirable self-oscillation is significantly reduced since the majority of the light which is reflected back from the output facet is directed by the etched grooves away from the gain region and prevented from striking the input facet.

When the device is used as a laser amplifier, both the input and output facets are anti-reflection coated.

However, when the device is used as a laser oscillator, only the output facet is anti-reflection coated. The input facet may not be coated or may be coated with a reflective coating. Thus, a sufficient portion of the light which is reflected off of the center of the output facet back towards the input facet between the cavity spoiling grooves is again reflected back into the semiconductor cavity resulting in oscillation. Most of the light reflected off of the non-central part of the output facet is not returned to the input facet, but strikes the spoiling grooves and is directed thereby away from the gain region. By virtue of oscillating with only the light striking the centermost portion of the output facet, oscillation of higher order spatial modes is suppressed.

DETAILED DESCRIPTION OF THE INVENTION

Figure 1:
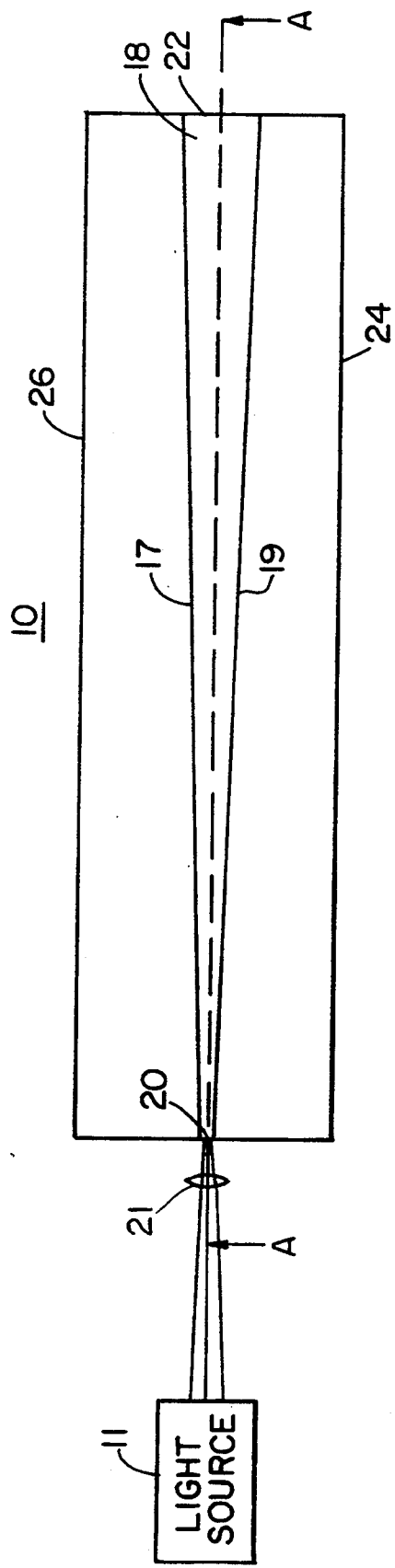
FIG. 1 is a plan view of a tapered gain structure laser amplifier of the prior art.
Figure 2:
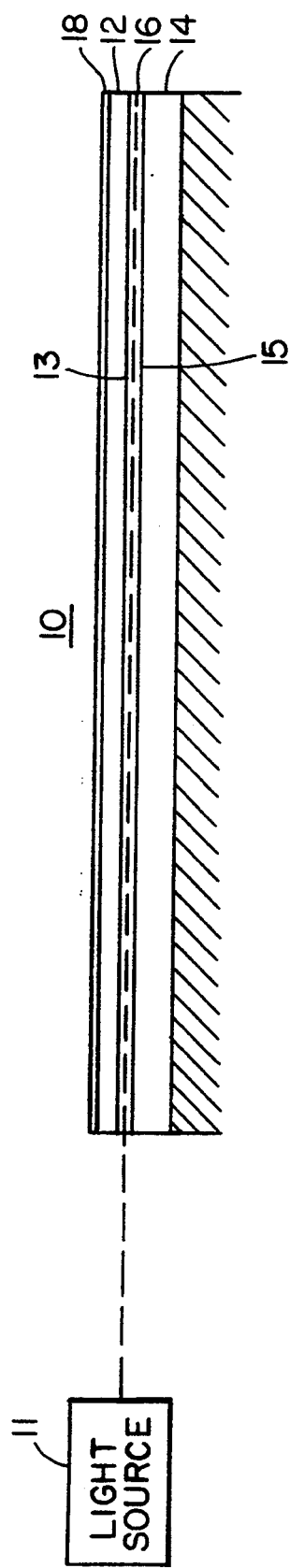
FIG. 2 is a cross-sectional view taken along line 2—2 of FIG. 1.
Figure 3:
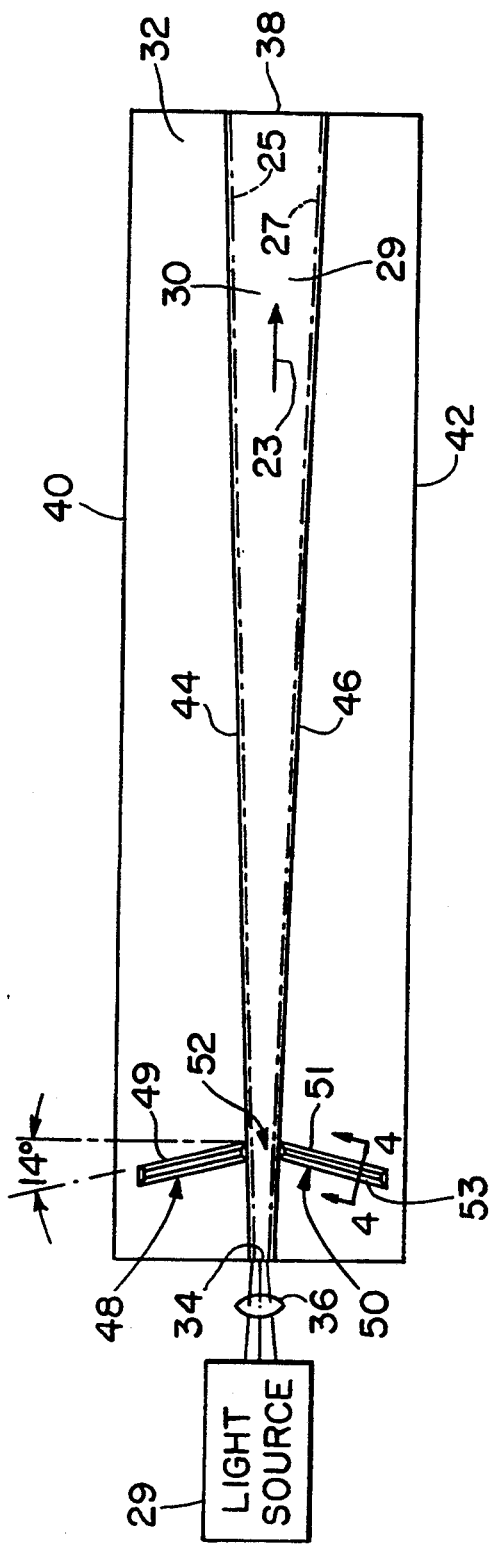
FIG. 3 is a plan view of the semiconductor gain structure of the present invention configured as a laser amplifier.
Figure 4:
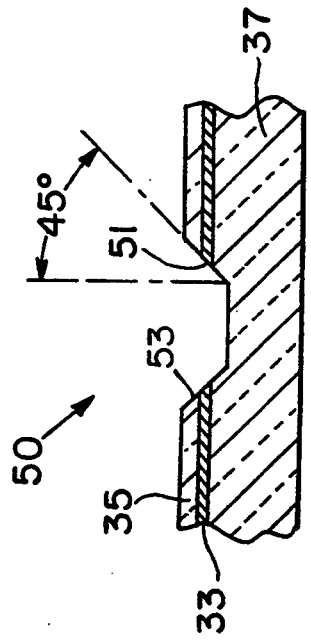
FIG. 4 is a cross-sectional view taken along line 4—4 of FIG. 3.

FIG. 3 is a plan view of the semiconductor laser amplifier of the present invention. FIG. 4 is a cross-sectional view taken along line 4—4 of FIG. 3. The semiconductor layer structure comprises a composite gain layer 33 sandwiched between two layers of oppositely doped high bandgap material 35 and 37. In the preferred embodiment, the active layer comprises a single quantum-well of $In_xGa_{1-x}As$ embedded in a composite $GaAs/Al_yGa_{1-y}As$ structure which provides optical and carrier confinement. Note: $0<x>1 o<y>1$. Other active layer structures are also possible.

A tapered gain region 31 is formed in the active layer and a tapered electrically conductive contact 30 is placed on surface 32 of the semiconductor structure over and commensurate with the gain region 31. Since gain region 31 is in active layer 33, it is shown in phantom by dotted lines 25 and 27 in FIG. 3. The edges 17 and 19 of contact 30 essentially overlay boundaries 25 and 27 of the gain region 31. The degree of taper of the gain region (and consequently contact 30) is selected so as to allow the input beam to spread naturally such that its light intensity profile has no nulls when it reaches output facet 38. Contact 30 may be metal.

Light from a laser light source 29 is introduced to input facet 34 through focusing lens 36. Input and output facets 34 and 38 are preferably cleaved. Alternately, they may be etched. The input and output facets 34 and 38 are shown in FIG. 3 as planar. However, one or both of the facets may be curved. The lateral edges 40 and 42 of the semiconductor are preferably saw-cut.

No intentional gradient in the refractive index of the material is imposed at the boundaries 44 and 46 of the gain region. Accordingly, reflectivity at the gain region boundaries 44 and 46 is minimized. The boundaries 44 and 46 of the gain region are defined solely by conductive metal contact 30.

Reflective cavity spoiling grooves 48 and 50 are etched through the wave guiding layer so as to form surfaces 49 and 51 which are formed through the wave guiding layer. The grooves are positioned so as to receive a majority of the light reflected off of the output facet 38 before it is returned to the input facet 34. In order to receive the most light possible, the grooves should be positioned close to the input facet 34 where the gain region is the most narrow and should extend substantially from the boundaries of the gain region 44 and 46 to the lateral edges 40 and 42 of the semiconductor. In this manner, only the light which is returned in the central portion of the gain region through narrow gap 52 between the cavity spoiling grooves 48 and 50 reaches input facet 34.

Although there is intrinsic inter-band absorption loss outside of the gain region, such inter-band absorption can be saturated by the electromagnetic fields which build up in the gain region. Accordingly, in the absence of the cavity spoilers of the present invention, self-oscillation can occur despite inter-band absorption.

The grooves are etched at an angle such that surfaces 49 and 51 reflect and/or scatter the light they receive away from the gain region. A gap 52 is provided between the grooves 48 and 49 and grooves 51 and 53 to allow the input light to propagate between the grooves down the gain region. The grooves should be etched at an angle to deflect the light they receive towards the sides of the semiconductor (e.g., saw-cut sides 40 and 42) and/or out of the plane of the active layer (e.g., towards the substrate). Accordingly, the particular orientation of the grooves depends upon the relative angle of the output facet, the diffraction angle of the light and, consequently, the angle of taper of the gain region.

In at least one preferred embodiment, the grooves are angled at 14° from the plane parallel to the output facet 38 and 45° from the plane of the wave guiding layer as shown in FIG. 4. Accordingly, in this embodiment, the reflecting surfaces 49 and 51 tend to deflect the light both out of the active layer and towards the sides 40 and 42.

Precision groove etching is only one way to create reflective surfaces for cavity spoiling purposes. Any other means for creating a sharp change in refractive index in the wave guiding layer so as to create a reflective surface may also be used.

Figure 5:
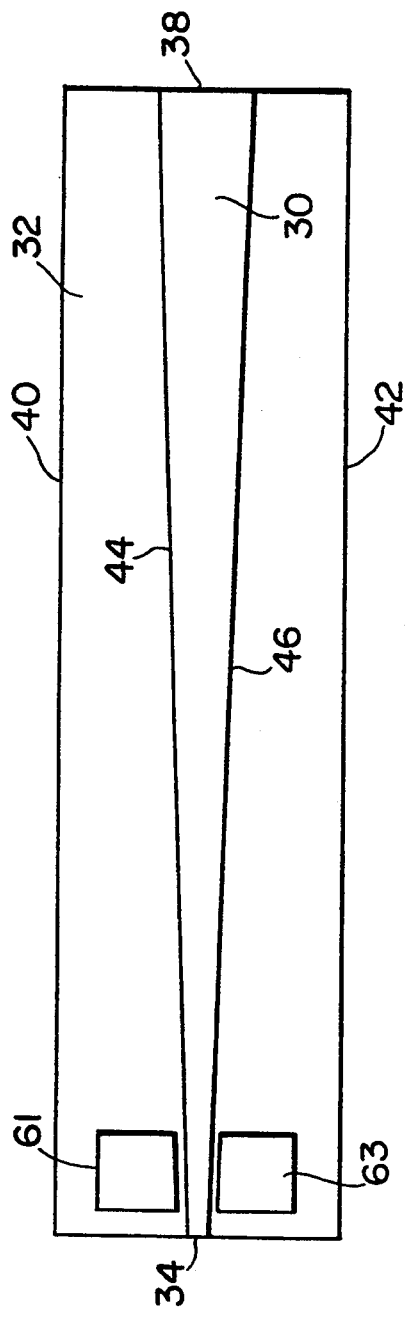
FIG. 5 is a plan view of a second embodiment of the semiconductor gain structure of the present invention.

Alternately, the cavity spoilers may comprise means for absorbing the light, such as reverse biased junctions formed in the active wave guiding layer as shown in FIG. 5. To create reverse biased junctions, electrodes 61 and 63 are placed on the top surface of the semiconductor and supplied with a reverse biasing voltage.

Figure 6:
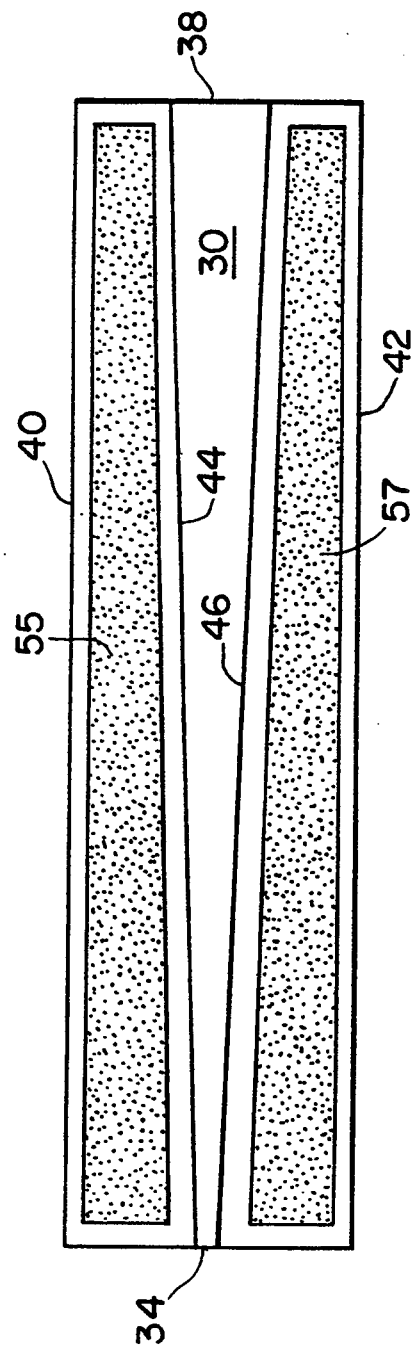
FIG. 6 is a plan view of a third embodiment of the semiconductor gain structure of the present invention.

It is also possible to form cavity spoilers on opposite sides of the gain region along the entire length of the gain region to absorb the light reflected off the end facet 38. In this full length type of embodiment, the cavity spoilers can be formed by a reverse biased junction along the entire length of the gain region. Alternately, ion implanted regions, such as regions 55 and 57 in FIG. 6, can be formed along the entire length of the gain region 30. Similarly to reverse biased junctions, ion implanted regions will absorb the light which enters them. Proton bombardment is one exemplary means for creating ion implanted regions. However, other types of ion implantation techniques may also be used.

When the gain structure is utilized as an amplifier, both the input facet 34 and the output facet 38 are coated with an anti-reflection coating so as to minimize reflection off of these surfaces. Nevertheless, some light is reflected off of the output facet 38 and returned into the semiconductor towards the input facet 34. The majority of such light will strike the cavity spoiling grooves 48 and 50 whereupon it will be reflected off of the etched grooves either towards the saw-cut edges 40 and 42 and/or down into the substrate (not shown). The small amount of light which passes through the gap 52 between the grooves strikes the input facet which is also coated with an anti-reflective coating. Accordingly, since the majority of light reflected off of output facet 38 strikes the cavity spoiling grooves, the amount of light which can oscillate within the semiconductor is significantly reduced. The light absorbing embodiments of FIGS. 5 and 6 function in a similar way to eliminate oscillations.

By having the smallest possible index gradient at the boundaries 44 and 46 of the gain region, excitation of high-order modes is substantially eliminated. Such modes would tend to be dispersive and to create extra phase variations across the beam. The spatial beam quality would, in turn, be deteriorated.

However, since there is no intentionally imposed refractive index gradient at the boundaries, most of the light which strikes the boundary simply passes through it rather than being reflected back into the gain region. A small amount of index guiding may be unavoidable due to thermal effects caused by the current flowing through the contact pad 30 as well as gain saturation effects and strain effects. Nevertheless, these effects would only cause a small fraction of the output power to fall outside of the main spatial mode.

Figure 7:
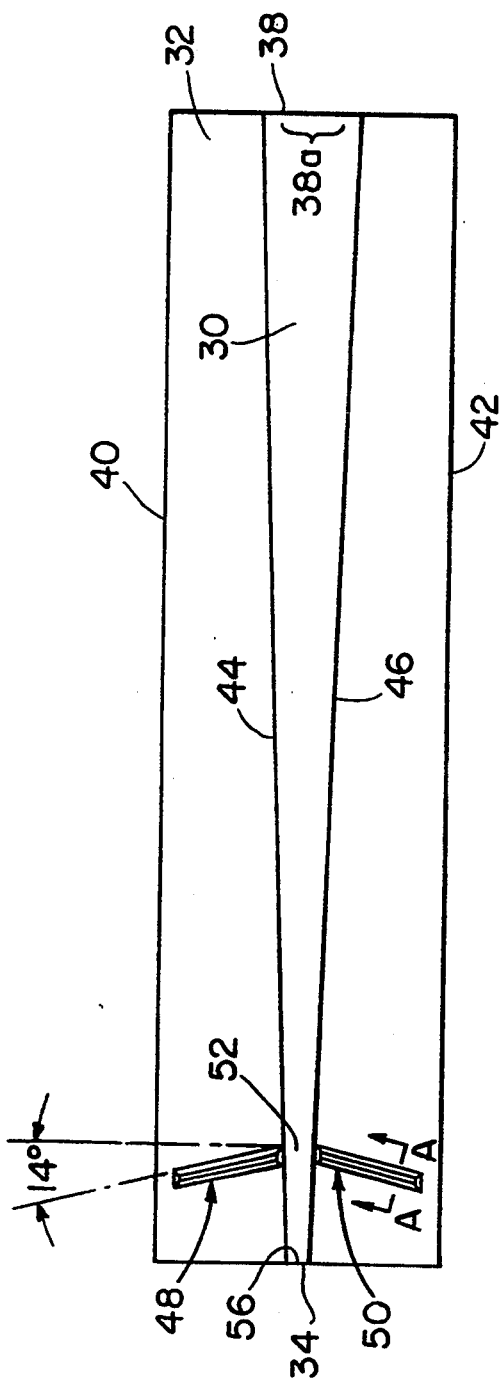
FIG. 7 is a plan view of a fourth embodiment of the semiconductor gain structure of the present invention configured as a laser oscillator.

The gain structure disclosed herein may also be modified for use as a laser oscillator, i.e., a laser light source. FIG. 7 is a plan view of the gain structure of the present invention modified to achieve a controlled self-oscillation in a single-lobed spatial mode so as to achieve lasing action. In FIG. 7, like features are indicated with the same reference numerals as in FIG. 3. The structure is essentially identical to the FIG. 3 embodiment except that no input light source is provided and input facet 34 is replaced with interface 56. Interface 56 may be an etched or cleaved facet which may or may not be coated with anti-reflection coating in order to provide sufficient reflectivity. Alternately, interface 56 may be adjacent a diffraction grating. Accordingly, a significantly greater portion of the light reflected off of the output facet which is returned between the cavity spoiling grooves to facet 56 is reflected back into the semiconductor. Accordingly, a significantly large amount of feedback is allowed so that lasing may occur.

The employment of the etched grooves in this configuration as an oscillator leads to a predominantly single-lobed output beam. As previously explained, the majority of the light which is reflected off of the output facet 38 strikes the etched grooves 48 and 50 and is directed out of the semiconductor. Only the portion of the light which strikes the output facet 38 very close to its center, as illustrated at 38a in FIG. 7, can pass through the gap 52 between the etched grooves 48 and 50 and strike the interface 56.

Figure 8:
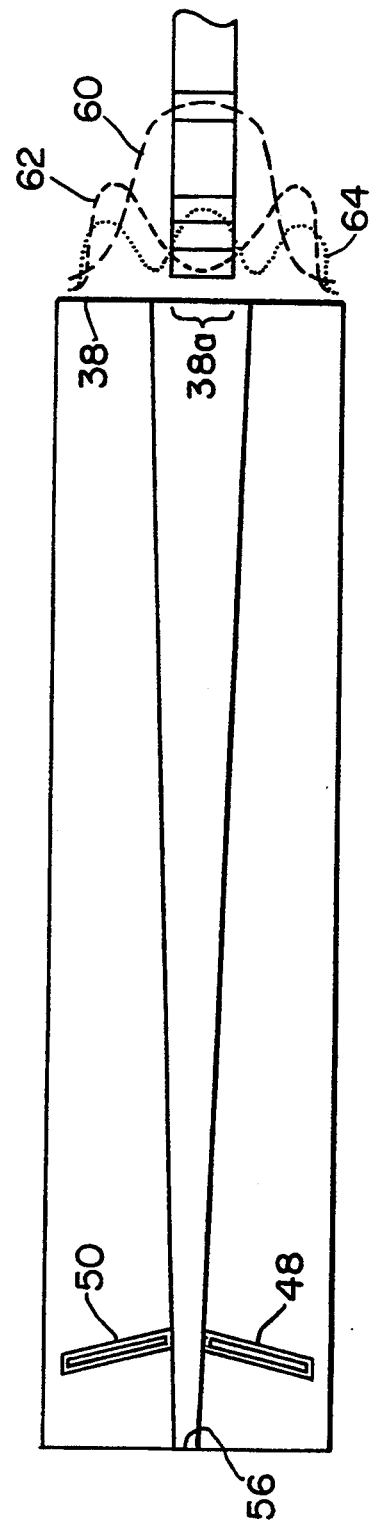
FIG. 8 is an illustration of exemplary light distributions of light traveling in the laser oscillator of FIG. 5.

As illustrated in FIG. 8, the vast majority of light which strikes the center 38a of the output facet 38 is very uniform in intensity thus leading to superior suppression of high order spatial distribution modes. Curve 60 in FIG. 8 illustrates an exemplary spatial light intensity distribution of light propagating in the gain region in the lowest order spatial mode. Higher order spatial modes do not oscillate because they do not have sufficient gain in the cavity design. Dashed curve 62 and dotted curve 64 illustrate the spatial light intensity distributions of the non-oscillating next two higher order spatial modes. As can be seen by the juxtaposition of curve 60 with the center portion 38a of the output facet 38, an extremely flat portion of the light intensity distribution curve of the lowest order mode 60 strikes the output facet in the center region 38a (i.e., the region which will return light to interface 56 for oscillation).

It can also be seen with respect to the second and third order modes shown by curves 62 and 64 that the light intensity distribution in region 38a is not as uniform as curve 60 and is of much lower power than curve 30. Accordingly, higher spatial mode suppression is achieved for two primary reasons. First, a much lower amount of light energy in the higher modes is returned to the input facet 56. Second, the light of the lowest order spatial mode which is returned to the input facet is extremely uniform in intensity because the flattest portion of the light distribution curve strikes region 38a of the output facet 38, Accordingly, oscillation of light of extremely uniform light distribution occurs, thus leading to superior suppression of high order modes.

Figure 9:
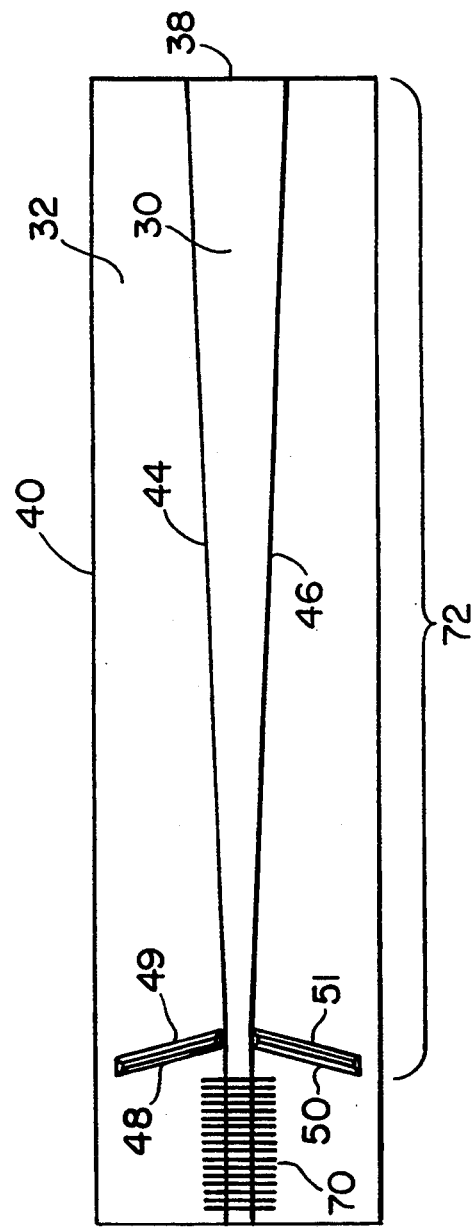
FIG. 9 is a plan view of a fifth embodiment of the semiconductor gain structure of the present invention configured as a monolithically integrated master oscillator/power amplifier combination.

The gain structure disclosed herein may also be used in a monolithically integrated master oscillator/power-amplifier combination as illustrated in FIG. 9. The amplifier section 72 operates in the same fashion as previously described. However, the input light, instead of being focused into the amplifier from a separate, external light source, is introduced within the same wave-guiding layer from a semiconductor laser oscillator 70 incorporated in the same chip as the amplifier. The oscillator output should be constrained to the lowest order spatial mode of its structure. Preferably, separate electrical contacts to the oscillator and amplifier are used in order to control independently the currents in each section. The master oscillator 70 and power amplifier 72 may be adjacent to each other on the chip, as shown, or may be connected by a transverse optical wave-guide. An integrated lens may also be included between the output of the master oscillator and the input of the amplifier.

The feedback in the master oscillator which causes it to lase may be of the reflective type (cleaved or etched facets, or Bragg grating reflectors) or of the distributed feedback type (a grating located within and along the entire length of the master oscillator). Through proper design of the master oscillator, single frequency and lowest order spatial mode operation is obtained.

In this monolithic implementation, the reflectivity at the output of the master oscillator is the same as the reflectivity at the input of the power amplifier. In order to avoid self-oscillation of the power amplifier, sufficient power must be introduced from the master oscillator to saturate the amplifier gain in the desired amplified mode. Further, the self-oscillation threshold of the amplifier may be further reduced by using better antireflective coating on the output facet or by tilting or curving the output facet with respect to the axis of propagation of the light.

The gain structure disclosed herein was implemented as a laser amplifier. Total continuous wave output power in excess of 1.4 watts with 1.2 watts contained in a single-lobed spatial mode was achieved.

In this implementation, the reflective cavity spoiling grooves were fabricated by a reactive ion etching (RIE) process with the use of an oxide etch mask. The RIE system was operated at 28 mTorr pressure with a $H_2$:$CH_4$ plasma established by a 4:1 gas-flow ratio and an rf power of 0.9 watts/$cm^2$. The wafer was then coated with 300 nm of $SiO_2$. The linearly tapered contact pad was formed using photolithography to open the tapered pattern in the oxide. Metals (Ti/Au) were evaporated over the entire wafer making ohmic contact to the tapered region. The semiconductor amplifier was fabricated from InGaAs/AlGaAs graded-index separate-confinement heterostructure single-quantum-well semiconductor material. This type of strained-layer quantum well material has been shown to be inherently more reliable than conventional unstrained GaAlAs material. The device was 2 mm long and 200 μm wide at the broadest part of the taper. The input and output facets were cleaved and anti-reflection coated with a quarter-wave layer of $SiO_x$, where x is adjusted to give an index near 1.8, with a residual reflectivity estimated to be approximately 1%. The wavelength of operation for this embodiment was 970 nm.

The oscillator embodiment may also be implemented utilizing reverse biased junctions outside of the current injection region instead of the etched grooves. As previously discussed, the reverse biased junctions form absorbing regions that are difficult to optically saturate. It may also be possible to use other spoilers, such as long regions of proton-bombarded material or other absorbing schemes, and other techniques to create a sharp change in refractive index so as to form a reflecting/-scattering surface.

Using the inventive gain structure disclosed herein as a high power oscillator rather than an amplifier by applying the anti-reflection coating only to the output facet, an output power of 0.95 watts continuous wave has been achieved with a 1.5× diffraction limited output.

The inventive gain structure disclosed herein has wide applications. Depending on the composition and thickness of the active layers of the semiconductor material, the amplifiers can be made to operate at wavelengths in the 0.8 to 1.0 μm range. Accordingly, the present invention can be used as an amplifier or as an oscillator suitable for pumping rare-earth doped fiber amplifiers where high-spatial mode quality is required. In addition, these devices can be used in other pumping applications such as solid-state laser pumps, and particularly in end-pumped geometries. Since high spectral purity and high modulation rates can be achieved by controlling the master oscillator characteristics, these amplifiers can be used to build high-power transmitters for free-space optical communication systems. High-power diffraction limited diode sources may also be useful for efficient frequency-doubling in the blue-green region of the spectrum in optical-disk-memory and other applications.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A laser structure comprising:
   a longitudinally extending body of semiconductor material having first and second vertically extending interfaces at opposite longitudinal ends thereof, and opposed outer horizontally extending surfaces, in which body, electromagnetic radiation is reflected off and travels between said first and second interfaces;
   an electrically conductive contact adjacent to one of said outer surfaces of said body and extending between said first interface and said second interface, said electrically conductive contact being laterally tapered such that a portion of said contact is wider at one location than at another location and wherein body portions adjacent said contact form a gain region of said body which region is defined by the lateral dimensions of said contact; and a radiation removal section for receiving a portion of the electromagnetic radiation which is reflected off one of said interfaces and which travels laterally outside said gain region to remove said portion of electromagnetic radiation from said body.

2. The structure of claim 1 wherein the removal section comprises a radiation absorber.

3. The structure of claim 1 wherein the removal section comprises a radiation scatterer.

4. The structure of claim 1 wherein the removal section comprises a radiation reflector.

5. The structure of claim 1 wherein said removal section comprises reflective surfaces.

6. The structure of claim 1 wherein said body includes wave guiding layers vertically confining said electromagnetic radiation within said gain region and said removal section is comprised of grooves etched into one or more of said wave guiding layers; said grooves defining reflective surfaces which reflect said light reflected off one of said interfaces, away from said gain region.

7. A laser structure as set forth in claim 2 wherein said radiation absorber comprises reverse biased junctions formed in a wave guiding layer adjacent said gain region.

8. A laser structure as set forth in claim 1 wherein said removal section extends substantially alongside said gain region between said first and second interfaces.

9. A laser structure as set forth in claim 1 wherein said removal section comprises ion implanted regions formed in a guiding layer adjacent said gain region.

10. A laser structure as set forth in claim 9 wherein said ion implanted regions extend substantially alongside said gain region between said first and second end interfaces.

11. The laser structure as set forth in claim 1 wherein said contact is linearly tapered at an angle such that said gain region is large enough to allow electromagnetic radiation to expand in a substantially diffraction limited single-lobed beam within said gain region.

12. The laser structure as set forth in claim 1 wherein a wave guiding layer is provided vertically adjacent said gain region to vertically confine said radiation.

13. A laser structure as set forth in claim 1 wherein said second interface is anti-reflection coated.

14. A laser structure as set forth in claim 13 wherein said structure forms a laser oscillator and only radiation striking a center portion of said second interface produces oscillation thereby suppressing oscillation of higher modes.

15. A semiconductor laser comprising:
   a body of semiconductor material extending along a longitudinal axis having first and second interfaces extending transverse to said axis at opposite ends thereof and having longitudinally extending wave guiding layers for vertically confining light radiation injected into said body at said first interface which light travels between said layers to said second interface;
   an electrically conductive contact pad joined to an outer surface of one of said layers and extending from said first interface to said second interface, said electrically conductive contact pad being laterally tapered in a longitudinal direction thereby defining a laser gain region in the body opposite said pad; and radiation removers in one of said layers positioned vertically adjacent and on laterally opposite sides of said gain region so as to receive a portion of the light radiation which is reflected off of said second interface back into said body outside said gain region and remove it from said body of semiconductor material.

16. A semiconductor laser as set forth in claim 15 wherein said contact pad is sufficiently tapered to allow light radiation to expand in a substantially diffraction limited single-lobed beam within said gain region.

17. A laser as set forth in claim 15 wherein said radiation remover is comprised of grooves etched into a wave guiding layer adjacent said first interface, said grooves defining reflective surfaces which reflect said light received off of said second interface outside said gain region and thereby remove it from said body.

18. A laser as set forth in claim 15 wherein said radiation remover comprises a radiation absorber.

19. A laser as set forth in claim 18 wherein said absorber comprises reverse biased junctions formed in a wave guiding layer for absorbing said radiation reflected off said second interface outside said gain region.

* * * * *